(12) United States Patent
Gunda

(10) Patent No.: US 9,761,417 B2
(45) Date of Patent: Sep. 12, 2017

(54) AION COATED SUBSTRATE WITH OPTIONAL YTTRIA OVERLAYER

(75) Inventor: Nilesh Gunda, North Chelmsford, MA (US)

(73) Assignee: ENTEGRIS, INC., Billerica, MA (US)

(*) Notice: Subject to any disclaimer, the term of this patent is extended or adjusted under 35 U.S.C. 154(b) by 0 days.

(21) Appl. No.: 14/234,023

(22) PCT Filed: Aug. 9, 2012

(86) PCT No.: PCT/US2012/050093
§ 371 (c)(1),
(2), (4) Date: Jan. 21, 2014

(87) PCT Pub. No.: WO2013/023029
PCT Pub. Date: Feb. 14, 2013

(65) Prior Publication Data
US 2014/0178679 A1    Jun. 26, 2014

Related U.S. Application Data

(60) Provisional application No. 61/521,822, filed on Aug. 10, 2011.

(51) Int. Cl.
| | | |
|---|---|---|
| H01J 37/32 | (2006.01) | |
| C23C 14/00 | (2006.01) | |
| C23C 14/06 | (2006.01) | |
| C23C 14/08 | (2006.01) | |

(Continued)

(52) U.S. Cl.
CPC .... *H01J 37/32495* (2013.01); *C23C 14/0021* (2013.01); *C23C 14/0676* (2013.01); *C23C 14/083* (2013.01); *C23C 14/3485* (2013.01); *C23C 14/35* (2013.01); *H01J 37/32477* (2013.01); *Y10T 428/265* (2015.01)

(58) Field of Classification Search
None
See application file for complete search history.

(56) References Cited

U.S. PATENT DOCUMENTS

| 4,950,558 A | 8/1990 | Sarin |
| 6,387,509 B1 | 5/2002 | Goto |
| 8,247,080 B2 | 8/2012 | Iacovangelo et al. |

(Continued)

FOREIGN PATENT DOCUMENTS

| JP | H07-153370 | 6/1995 |
| JP | 2006157043 A | 6/2006 |

(Continued)

OTHER PUBLICATIONS

Notification of Transmittal of the International Search Report and the Written Opinion of the International Searching Authority, or the Declaration for International Application No. PCT/US2012/050093, "AION Coated Substrate with Optional Yttria Overlayer", Date of Mailing: Feb. 28, 2013.

(Continued)

*Primary Examiner* — Vera Katz

(57) ABSTRACT

A fluorine plasma resistant coating on a substrate being a component in a semiconductor manufacturing system is disclosed. In one embodiment the composition includes an AION coating that overlies a substrate, and an optional yttria coating layer that overlies the AION coating, with a total coating thickness of about 5-6 microns.

11 Claims, 25 Drawing Sheets

| At. % | N | O | F | Al | Si | Y |
|---|---|---|---|---|---|---|
| 1 | 0.6 | 57.8 | 0.4 | 0.0 | 0.7 | 40.5 |
| 2 | 0.5 | 53.9 | 2.5 | 0.0 | 1.1 | 41.9 |
| 3 | 0.0 | 28.0 | 0.0 | 46.1 | 1.0 | 1.1 |
| 4 | 1.9 | 55.3 | 0.0 | 1.0 | 41.3 | 0.6 |

- Cross-section of coating has been analyzed from a fracture.
- Thickness of barrier layer measured about 2 um.
- Thickness of yttria coating measured about 3 um.
- Both coatings are intact after being used in fluorine environment.

(51) Int. Cl.
*C23C 14/34* (2006.01)
*C23C 14/35* (2006.01)

(56) References Cited

U.S. PATENT DOCUMENTS

| | | | |
|---|---|---|---|
| 2002/0100909 A1* | 8/2002 | Yamaguchi et al. | 257/59 |
| 2002/0125822 A1 | 9/2002 | Graff et al. | |
| 2003/0209710 A1* | 11/2003 | Yamazaki et al. | 257/66 |
| 2004/0002221 A1 | 1/2004 | O'Donnell et al. | |
| 2006/0115964 A1 | 6/2006 | Findikoglu et al. | |
| 2009/0137101 A1* | 5/2009 | Yamazaki | H01L 21/76254 438/479 |
| 2010/0129670 A1 | 5/2010 | Sun et al. | |
| 2010/0221905 A1 | 9/2010 | Hautala et al. | |
| 2011/0133181 A1* | 6/2011 | Yamazaki | 257/43 |
| 2011/0135915 A1 | 6/2011 | Lee et al. | |
| 2013/0284373 A1 | 10/2013 | Sun et al. | |
| 2014/0099491 A1 | 4/2014 | Ameen et al. | |

FOREIGN PATENT DOCUMENTS

| | | |
|---|---|---|
| JP | 2009-287058 | 12/2009 |
| TW | 436469 B | 5/2001 |
| WO | WO 2011/066314 | 6/2011 |
| WO | WO 2015/077601 A1 | 5/2015 |

OTHER PUBLICATIONS

Notification of Transmittal of International Preliminary Report on Patentability for International Application No. PCT/US2012/050093, "AlON Coated Substrate with Optional Yttria Overlayer", Date of Completion of Report: Jan. 3, 2014.
European Search Report issued in European Application No. 12822578.6 entitled "AlON Coated Substrate with Optional yttria Overlayer," Date of Mailing: Mar. 2, 2015.
Wolborski, M., et al., "Improved Properties of AlON/4H-SiC Interface for Passivation Studies," *Materials Science Forum*, vols. 600-603, pp. 763-766 (2008).
PCT/US2015/053260 (unpublished) "Articles Coated With Fluoro-Annealed Films", filed Sep. 30, 2015, Inventors: I-Kuan Lin, Nilesh, Gunda, Dennis Radgowski, and Chandra Venkatraman.
U.S. Appl. No. 14/870,981 (unpublished) "Articles Coated With Fluoro-Annealed Films", filed Sep. 30, 2015, Inventors: I-Kuan Lin, Nilesh, Gunda, Dennis Radgowski, and Chandra Venkatraman.
Machine translation of Japan 2014-525136 Office Action, mailed Oct. 24, 2016, 4 pages.

* cited by examiner

XPS composition survey of AlON coating and ceramic

|  | N | O | F | Al |
|---|---|---|---|---|
| At. % | 8.9 | 42.2 | 5.7 | 43.2 |

- Coating delaminates between barrier layer and quartz substrate.
- Relatively low concentration of fluorine on backside of coating may indicate that corrosion started from frontside of coating.

| At. % | N | O | F | Al | Si | Y |
|---|---|---|---|---|---|---|
| 1 | 0.6 | 57.8 | 0.4 | 0.0 | 0.7 | 40.5 |
| 2 | 0.5 | 53.9 | 2.5 | 0.0 | 1.1 | 41.9 |
| 3 | 0.0 | 28.0 | 0.0 | 46.1 | 1.0 | 1.1 |
| 4 | 1.9 | 55.3 | 0.0 | 1.0 | 41.3 | 0.6 |

- Cross-section of coating has been analyzed from a fracture.
- Thickness of barrier layer measured about 2 um.
- Thickness of yttria coating measured about 3 um.
- Both coatings are intact after being used in fluorine environment.

AlON COATED SUBSTRATE WITH OPTIONAL YTTRIA OVERLAYER

RELATED APPLICATION

This application is the U.S. National Stage of International Application No. PCT/US2012/050093, filed Aug. 9, 2012, which designates the U.S., published in English, and claims the benefit of U.S. Provisional Application No. 61/521,822, filed Aug. 10, 2011. The entire teachings of the above applications are incorporated herein by reference.

BACKGROUND OF THE INVENTION

There is a continuing need for coatings on quartz and other ceramic substrates that are resistant to fluorine plasma. These substrates are transparent and often used in coating and etching systems used in semiconductor manufacturing. Fluorine plasma can damage these substrates creating particulates that can contaminate semiconductor process wafers. In semiconductor manufacturing aluminum can also be a source of contamination of semiconductor wafers.

SUMMARY OF THE INVENTION

The invention pertains to aluminum oxynitride (AlON) coated substrates, such as quartz, aluminum alloys, steels, alumina, metals, alloys and other substrates that come into contact with fluorine plasma. The AlON coating is deposited onto the substrate by reactive pulsed DC magnetron sputtering processes to a thickness of from about 1 micron to about 10 microns.

AlON can be the only coating on the substrate or it can have an overlay of yttria to form a dual layer coating on the substrate. The thickness of the layers will depend upon the proximity of the substrate to the fluorine plasma source and the intensity of the plasma. The yttria layer can be deposited on the AlON layer by the same method of deposition as used for the AlON layer to a thickness of from about 1 micron to about 10 microns.

In one embodiment, when AlON is the only coating on the substrate, the coating thickness is from about 5 to about 6 microns.

In another embodiment, when yttria is overlaid on the AlON coating, the combined coating thickness of the yttria and AlON layers can be from about 5 to about 6 microns.

The coatings are highly pure and their morphologies, as seen by Scanning Electron Microscopy (SEM), are smooth, dense and exhibit homogeneous microstructures, without columnar structures that would weaken the coating under the fluorine plasma conditions. The coatings are able to conform to the substrate's surface. The AlON coating with optional yttria overlayer provides improved resistance to fluorine plasma corrosion and reduces particle contamination.

BRIEF DESCRIPTION OF THE DRAWINGS

The drawings accompanying and forming part of this specification are included to depict certain aspects of the invention. A clearer impression of the invention, and of the components and operation of systems provided with the invention, will become more readily apparent by referring to the exemplary, and therefore nonlimiting, embodiments illustrated in the drawings, wherein identical reference numerals designate the same components. Note that the features illustrated in the drawings are not necessarily drawn to scale.

DETAILED DESCRIPTION OF THE INVENTION

Figure 1A:
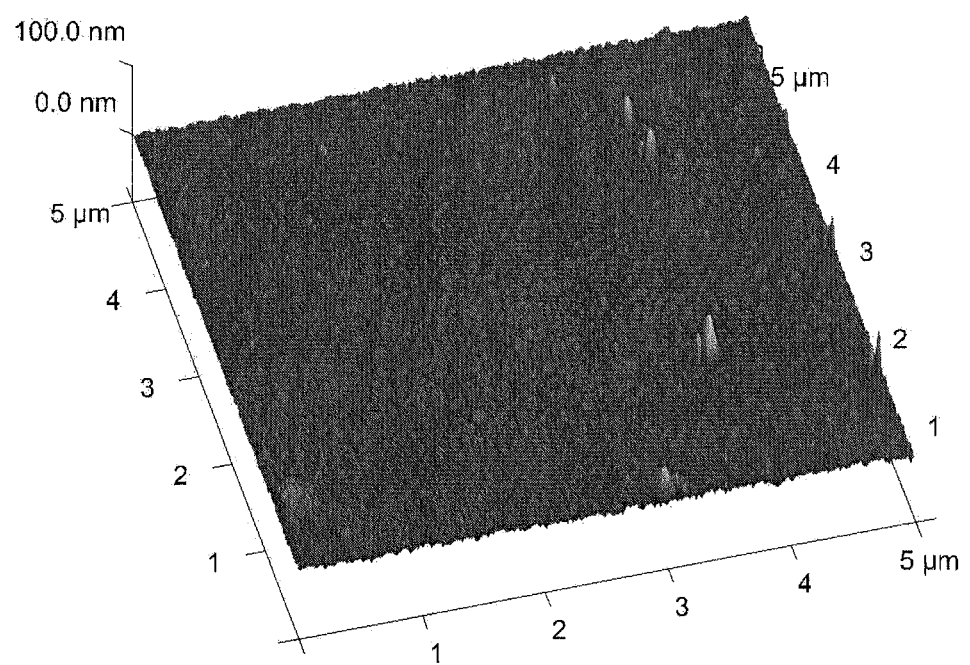
FIG. 1A is a micrograph of the AlON surface showing its morphology.

A description of example embodiments of the invention follows.

While various compositions and methods are described, it is to be understood that this invention is not limited to the particular molecules, compositions, designs, methodologies or protocols described, as these may vary. It is also to be understood that the terminology used in the description is for the purpose of describing the particular versions or embodiments only, and is not intended to limit the scope of the present invention which will be limited only by the appended claims.

It must also be noted that as used herein and in the appended claims, the singular forms "a", "an", and "the" include plural reference unless the context clearly dictates otherwise. Thus, for example, reference to an "AlON" coating is a reference to one or more layers of AlON and equivalents thereof known to those skilled in the art, and so forth. Reference to a "yttria" coating is a reference to one or more layers of yttria and equivalents thereof known to those skilled in the art, and so forth. Unless defined otherwise, all technical and scientific terms used herein have the same meanings as commonly understood by one of ordinary skill in the art. Methods and materials similar or equivalent to those described herein can be used in the practice or testing of embodiments of the present invention. All publications mentioned herein are incorporated by reference in their entirety. Nothing herein is to be construed as an admission that the invention is not entitled to antedate such disclosure by virtue of prior invention. "Optional" or "optionally" means that the subsequently described event or circumstance may or may not occur, and that the description includes instances where the event occurs and instances where it does not. All numeric values herein can be modified by the term "about," whether or not explicitly indicated. The term "about" generally refers to a range of numbers that one of skill in the art would consider equivalent to the recited value (i.e., having the same function or result). In some embodiments the term "about" refers to ±10% of the stated value, in other embodiments the term "about" refers to ±2% of the stated value. While compositions and methods are described in terms of "comprising" various components or steps (interpreted as meaning "including, but not limited to"), the compositions and methods can also "consist essentially of" or "consist of" the various components and steps, such terminology should be interpreted as defining essentially closed or closed member groups.

Although the invention has been shown and described with respect to one or more implementations, equivalent alterations and modifications will occur to others skilled in the art based upon a reading and understanding of this specification and the annexed drawings. The invention includes all such modifications and alterations and is limited only by the scope of the following claims. In addition, while a particular feature or aspect of the invention may have been disclosed with respect to only one of several implementations, such feature or aspect may be combined with one or more other features or aspects of the other implementations as may be desired and advantageous for any given or particular application. Furthermore, to the extent that the terms "includes", "having", "has", "with", or variants thereof are used in either the detailed description or the claims, such terms are intended to be inclusive in a manner similar to the term "comprising." Also, the term "exemplary" is merely meant to mean an example, rather than the best. It is also to be appreciated that features, layers and/or elements depicted herein are illustrated with particular dimensions and/or orientations relative to one another for purposes of simplicity and ease of understanding, and that the actual dimensions and/or orientations may differ substantially from that illustrated herein.

The problem of protecting quartz and other ceramic substrates from fluorine plasma while minimizing aluminum contamination is solved by depositing an aluminum oxynitride (AlON) coating of about 1 micron to 10 microns on a ceramic like quartz, and then overcoating the AlON with a yttria coating of about 1 micron to 10 microns. The combination of these coatings provides a composite that is transparent and that can withstand fluorine plasma processing as evidenced by no fluorine present by EDS (Energy-dispersive X-ray spectroscopy) analysis of a coated quartz substrate. The coating adheres to the underlying quartz or ceramic substrate as determined by the Scotch® Tape (available from 3M) test. The overlying yttria coating does not contain aluminum. The combination of AlON and yttria coating the quartz substrate provides improved resistance to fluorine plasma corrosion than a yttria only coating on quartz and reduces the particle contamination.

Without wishing to be bound by theory, the inventor has discovered that for a yttria only coating on quartz, the fluorine from a fluorine plasma appears to penetrate through the columnar structure of the yttria and attack the underlying quartz. A solution to this problem is a layer of AlON on top of the quartz, and then an optional layer of yttria over the AlON.

One version of the invention is a composition that includes an AlON coating that is about 2 microns thick that overlies a quartz substrate, a yttria coating layer that is about 3 microns thick overlies the AlON coating. The AlON and yttria coatings can be deposited by pulsed reactive physical vapor deposition. Deposition of AlON results in a coating is close to the stoichiometric composition of the bulk AlON. Aluminum oxynitride ceramic is available under the trademark ALON® Optical Ceramic by Surmet Corporation.

The AlON composition and properties are provided in Table 1.

TABLE 1

| Composition (at. %, +/−1%) | | | Purity | Hardness | Elastic Modulus | Electrical Resistivity | Roughness |
|---|---|---|---|---|---|---|---|
| Al | O | N | (at. %) | (DPHN) | (Gpa) | (Ω/□) | (nm) |
| 41% | 57% | 2.0% | 99.95% | 1300 | 190 | >$10^{12}$ | 2 |

Yttria composition and properties are provided in Table 2.

TABLE 2

| Composition (at. %, +/−1%) | | Purity | Hardness | Elastic Modulus | Electrical Resistivity | Roughness |
|---|---|---|---|---|---|---|
| Y | O | (at. %) | (DPHN) | (Gpa) | (Ω/□) | (nm) |
| 25% | 75% | 99.95% | 1400 | 190 | >$10^{12}$ | 8 |

Although the examples provided below use quartz as the substrate, any substrate that comes into contact with fluorine plasma can be used in the invention. Furthermore, any substrate containing aluminum in which it is desirable to prevent its contact with fluorine can be used as the substrate in the invention. Examples of suitable substrates include but are not limited to aluminum containing ceramics, steels, aluminum, alumina, quartz and other metals, alloys and ceramics. It will be apparent to the skilled person that the substrate to be coated will be any equipment used in semiconductor manufacturing that comes into contact with the fluorine plasma environment, such as but not limited to chamber and chamber components, wafer susceptor or chuck, showerhead, liners, rings, nozzles, baffles and fasteners, and wafer transport components.

EXAMPLES

Example 1

Example 1 illustrates an embodiment of the invention where an AlON coating (barrier layer, available from Entegris, Inc., Billerica, Mass.) made by pulsed reactive physical vapor deposition technique is coated on a quartz substrate. The AlON was overcoated with a layer of yttria (available from Entegris Inc.) The coated sample was exposed to a fluorine plasma environment. Chemical analysis showed that the top layer contained no aluminum, but had a composition similar to yttria. This result shows that a fluorine resistant coating overlying quartz can be made with AlON, but can be capped with a protective coating of yttria that does not include aluminum.

Figure 1B:
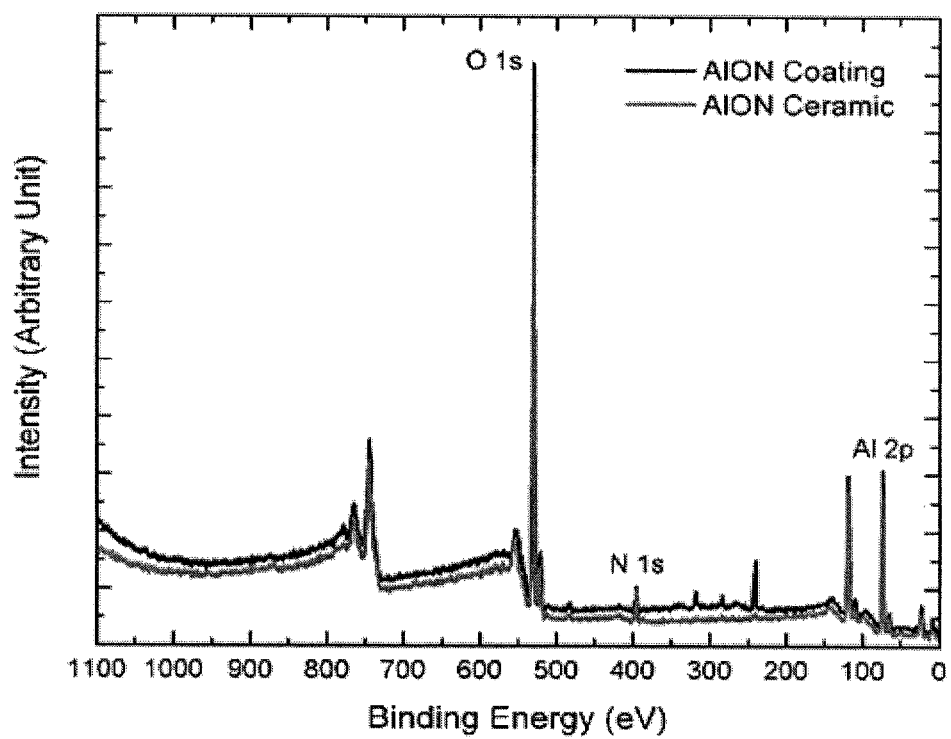
FIG. 1B shows the elemental composition of both AlON coatings and AlON ceramic as analyzed by X-ray photo-electron spectroscopy (XPS).
Figure 1C:
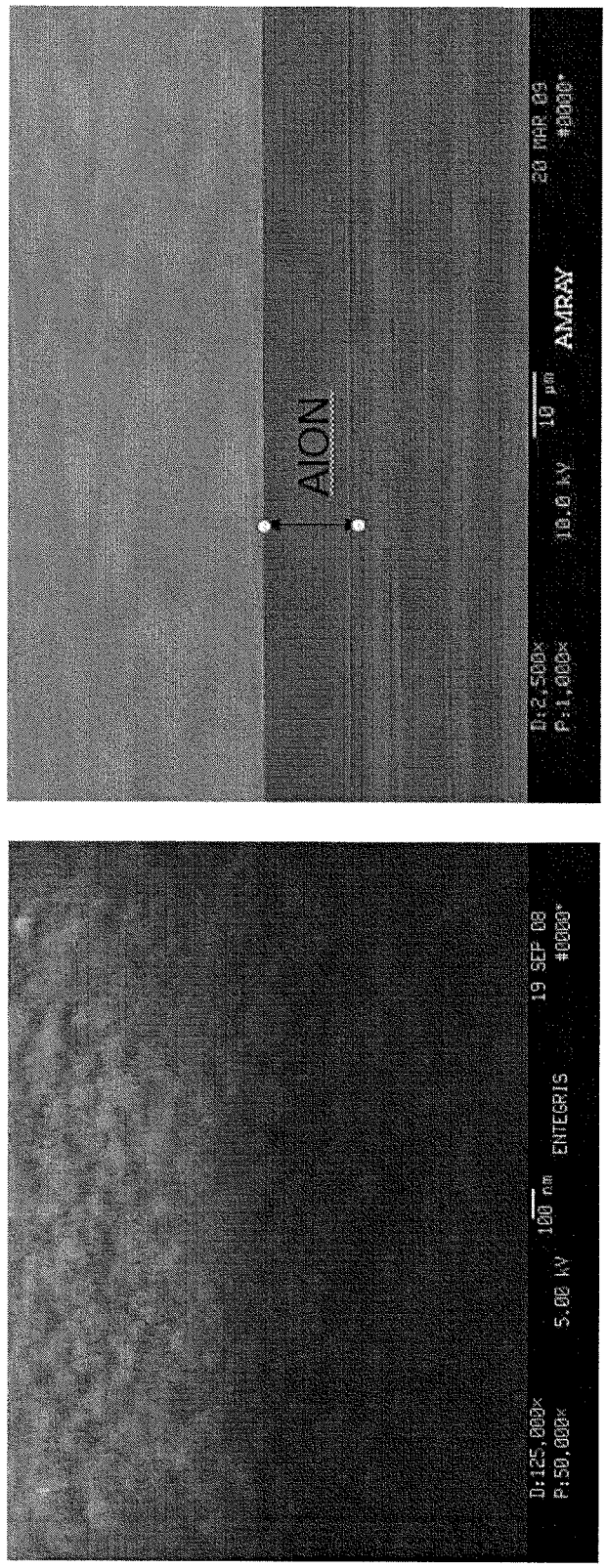
FIG. 1C shows SEM images from AlON cross section and morphology.
Figure 1D:
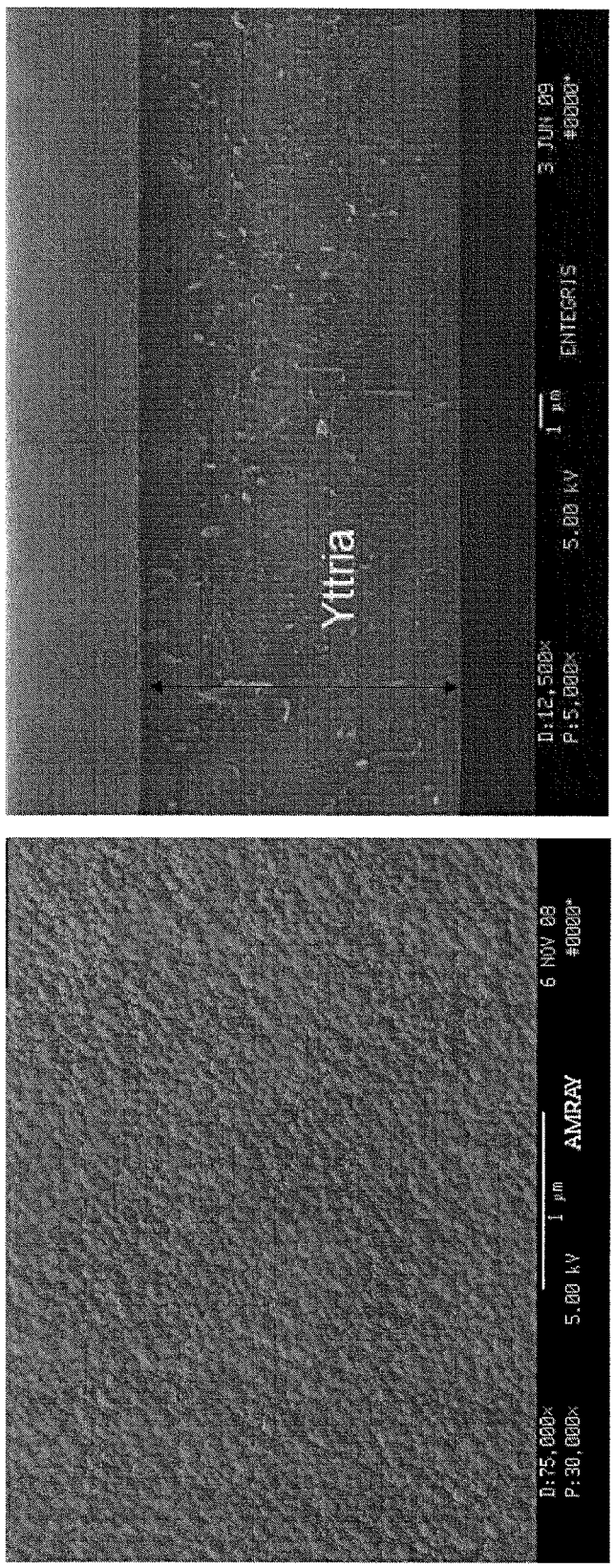
FIG. 1D shows SEM images from yttria cross section and morphology.
Figure 1E:
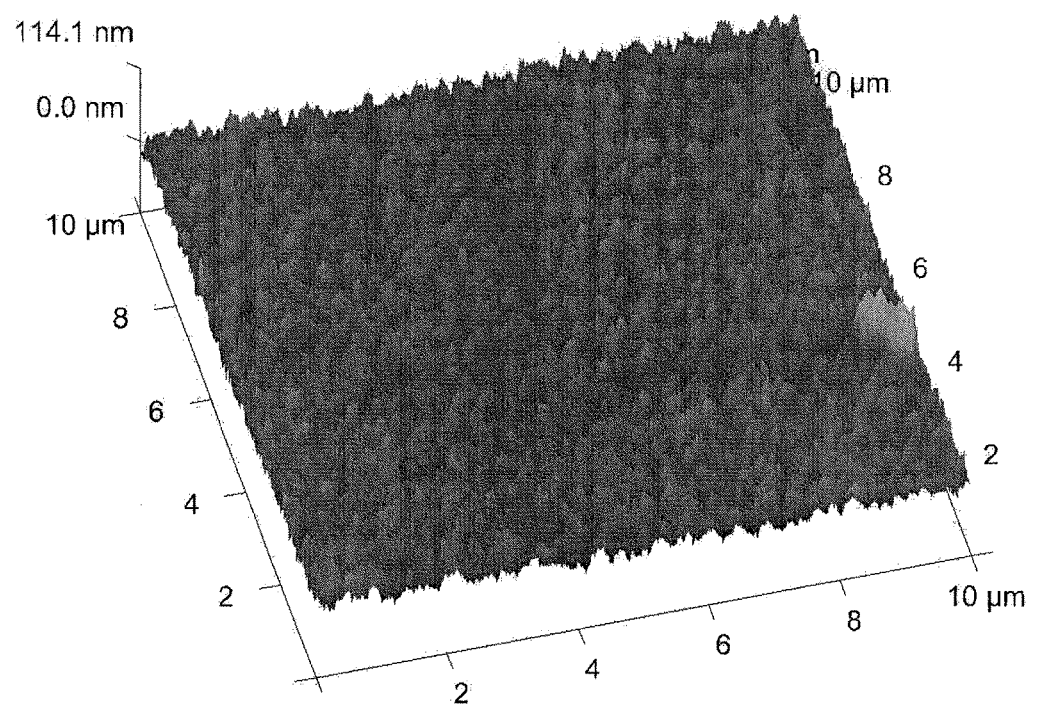
FIG. 1E shows a micrograph of the yttria coating morphology.
Figure 1F:
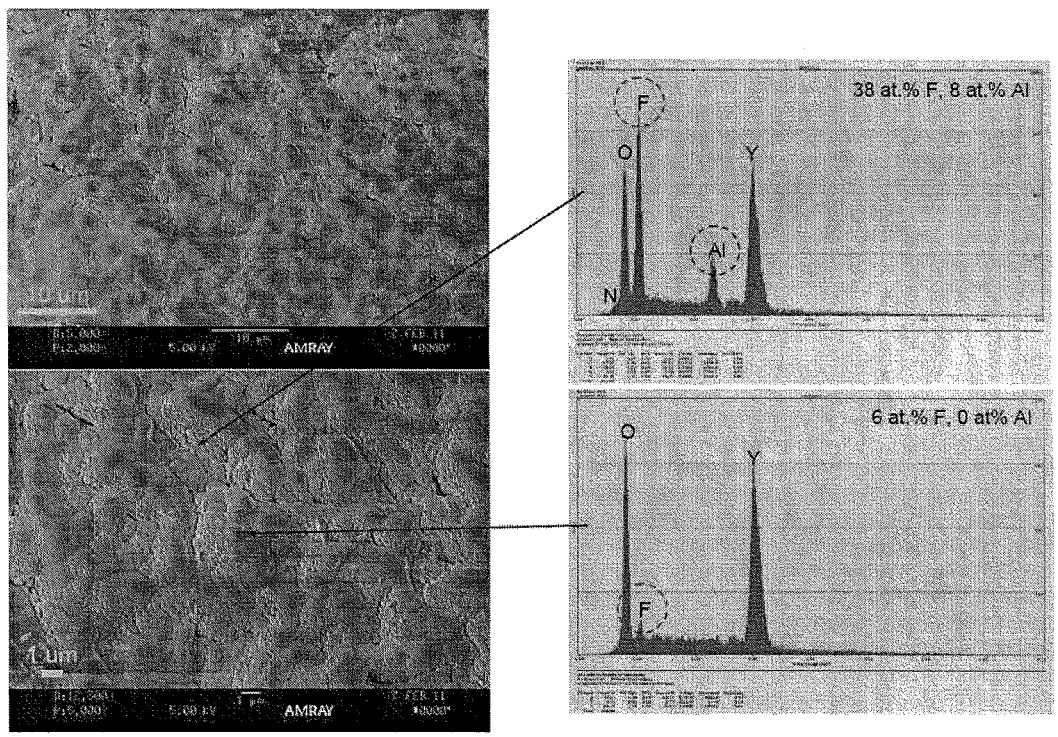
FIG. 1F shows an analysis for the frontside of a coating flake showing aluminum, yttria, oxygen and fluorine.
Figure 2:
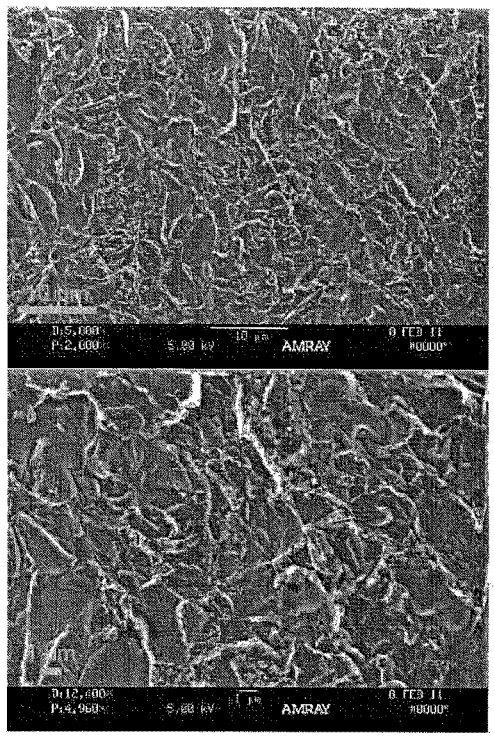
FIG. 2 shows the analysis for the backside of a coating flake.
Figure 2:
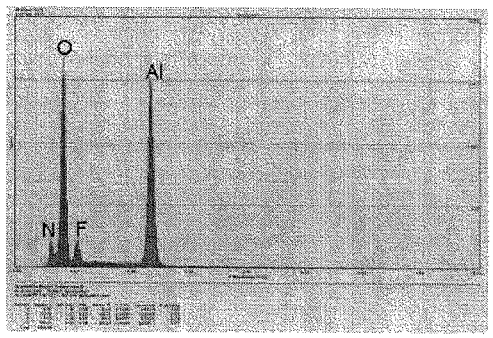
Figure 3:
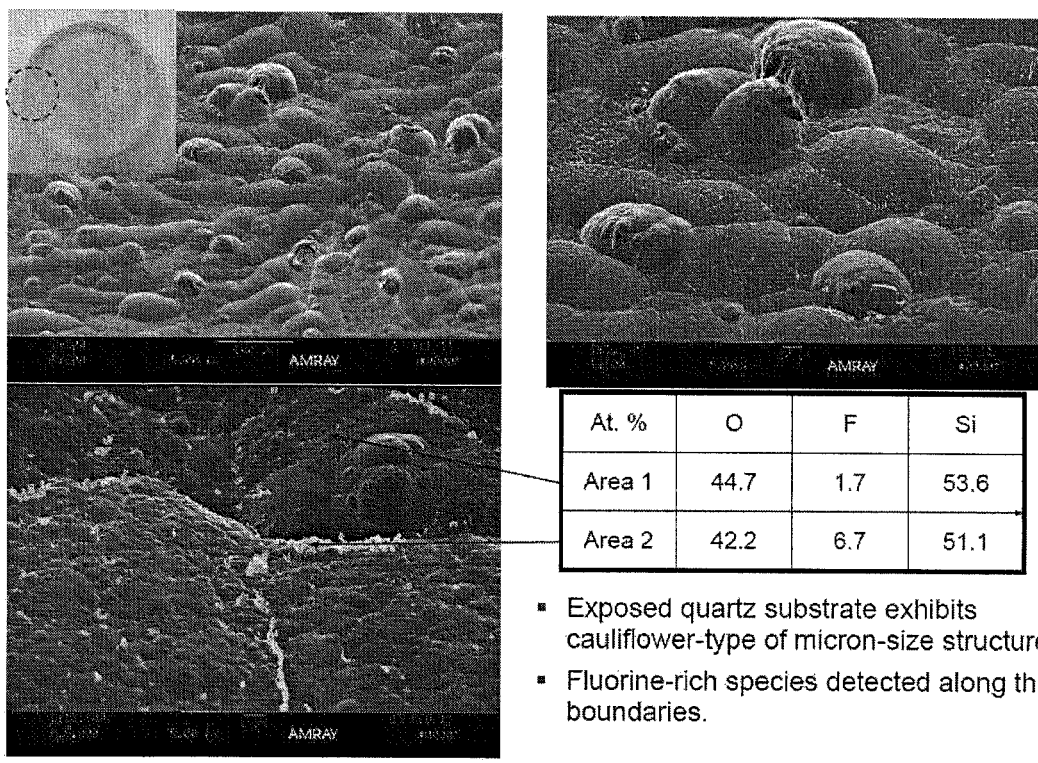
FIG. 3 shows an SEM micrograph of a sample exposed to fluorine plasma environment.
Figure 4:
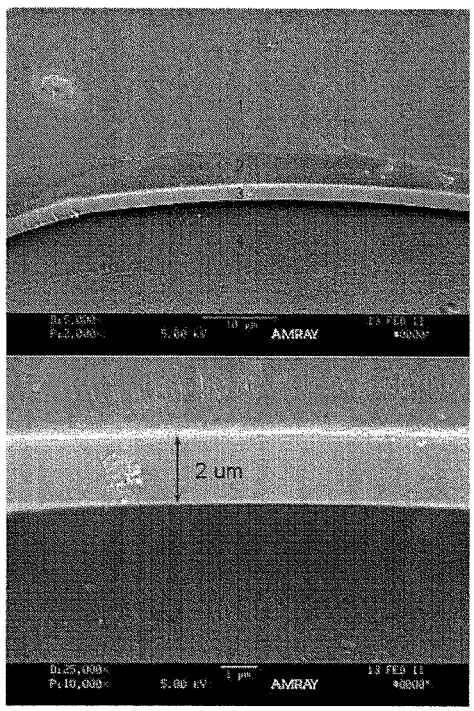
FIG. 4 shows a sample of quartz with yttria (yttrium 25%, oxygen 75%) coating and AlON (41% Al, 57% oxygen, 2% nitrogen) barrier layer exposed to a fluorine plasma; AlON coating overlies the quartz. The labeled layers have a composition by EDS that substantially corresponds to the composition of the layer; layers 1 and 2 are similar to yttria, layer 3 AlON, layer 4 quartz. Note that there is no detectable Aluminum in layer 1 and no detectable fluorine in layer 4.
Figure 5:
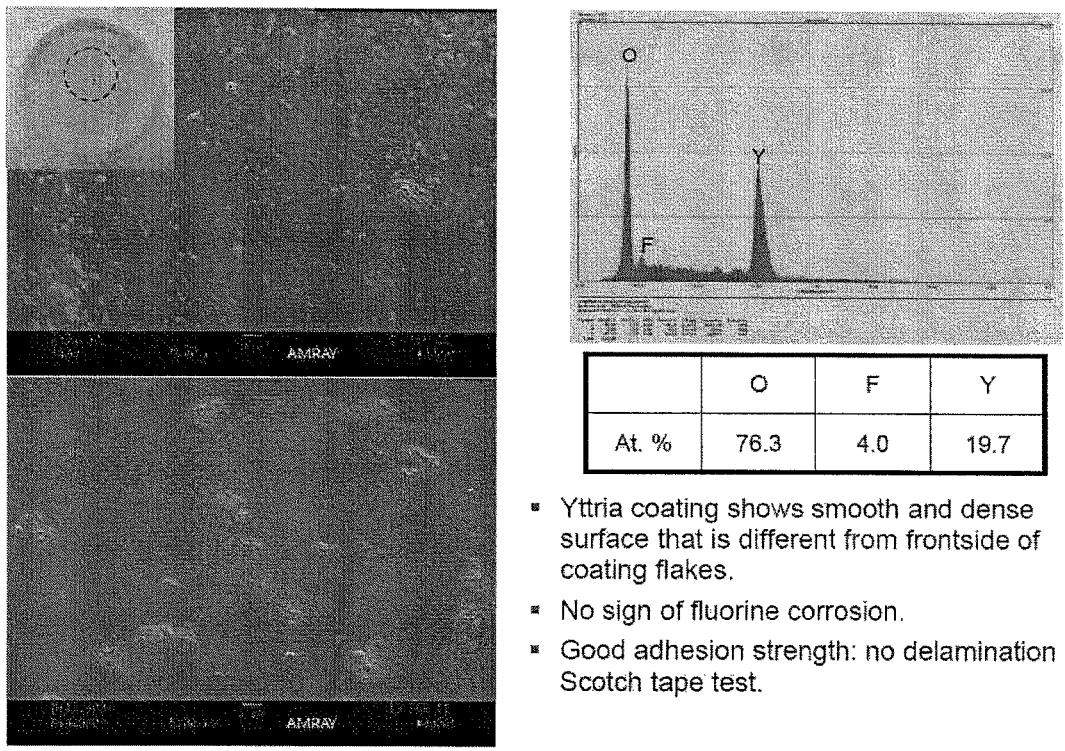
FIG. 5 shows intact yttria coating.
Figure 6:
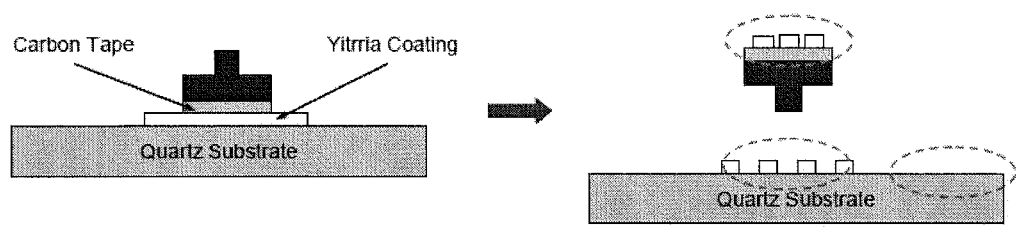
FIG. 6 illustrates a yttria only coating on a quartz substrate.
Figure 7:
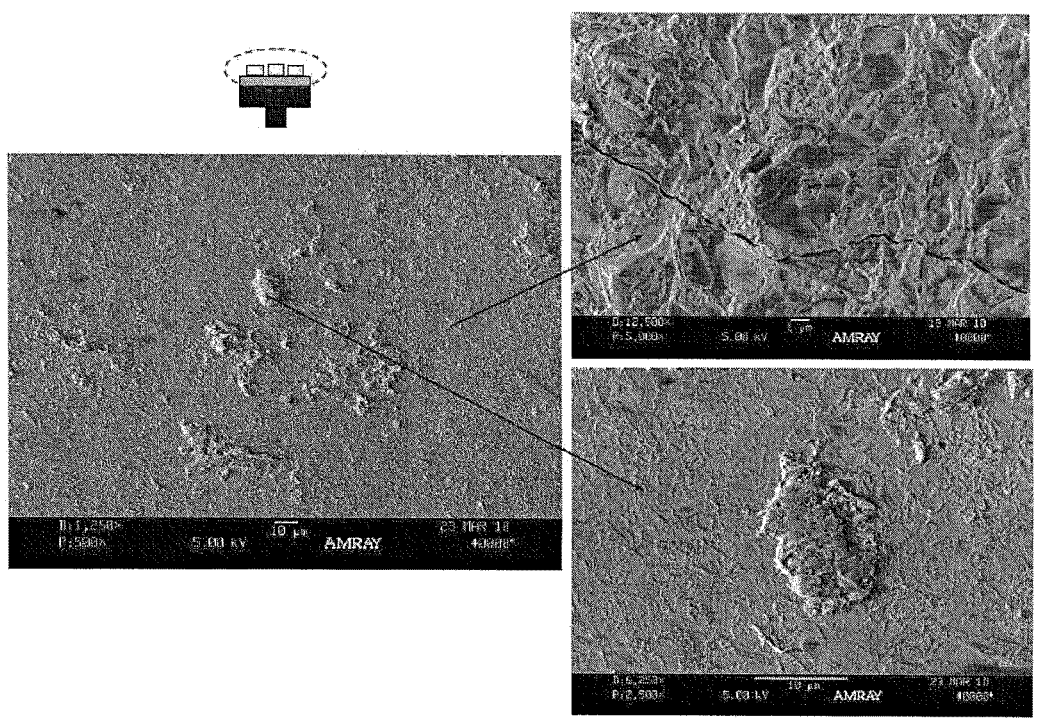
FIG. 7 shows micrographs of the backside of yttria coating (peeled).
Figure 8:
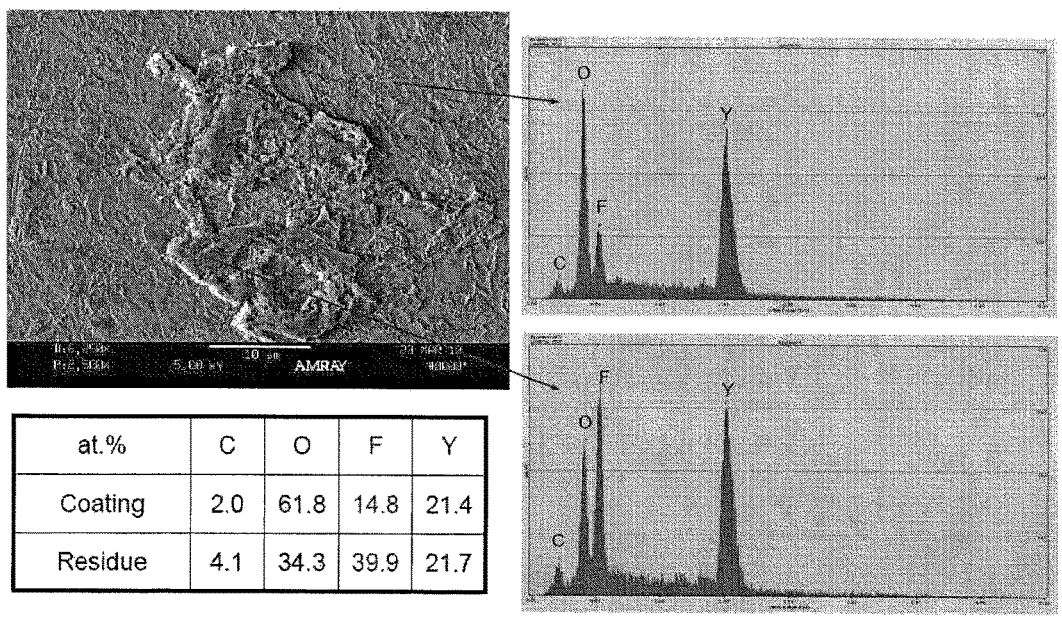
FIG. 8 shows micrographs of the backside of yttria coating (peeled).
Figure 9:
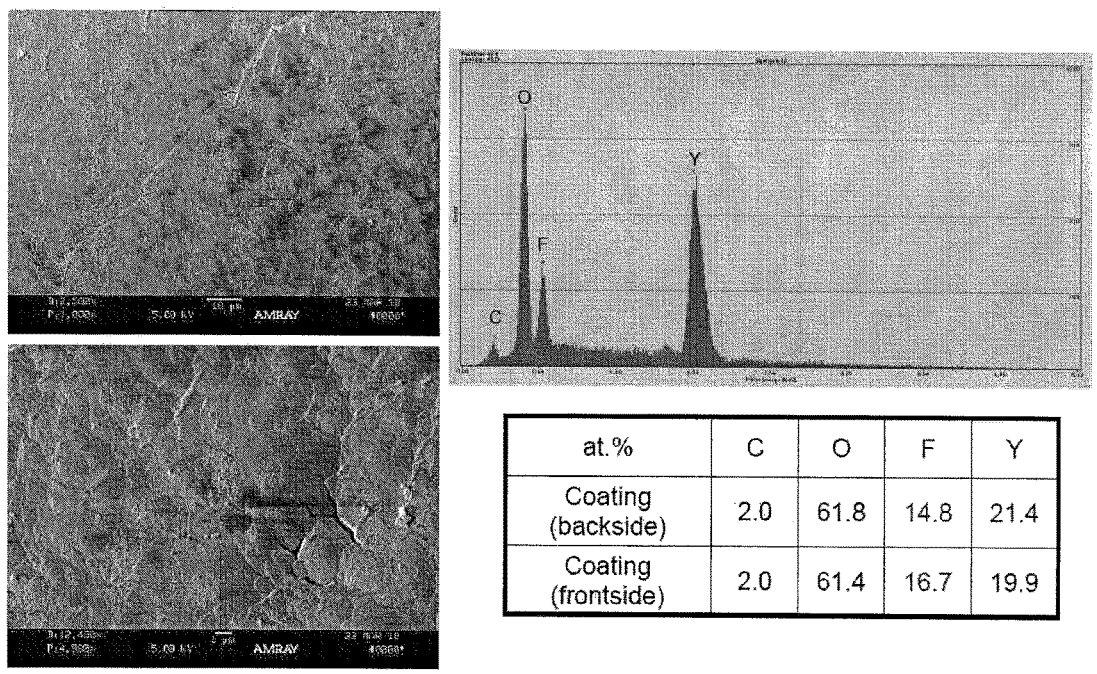
FIG. 9 shows micrographs of the frontside of yttria coating (peeled).
Figure 10:
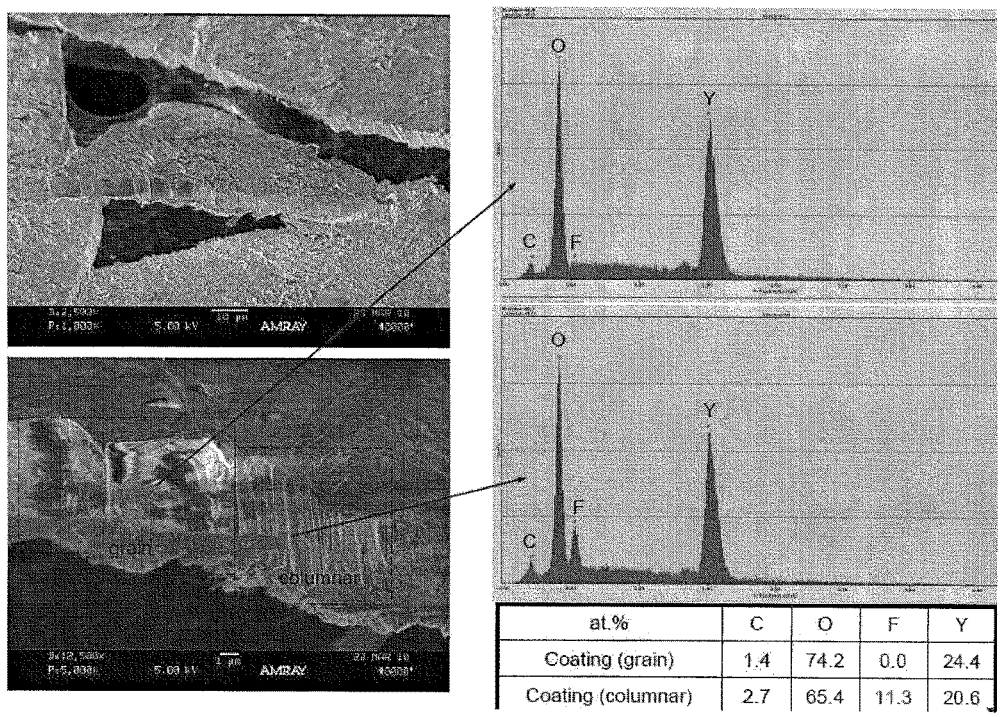
FIG. 10 shows scanning electron micrographs (SEM) of yttria coating that was exposed to a fluorine plasma. Two regions of the yttria coating, a grain and a columnar region are shown in the bottom SEM. The Energy-dispersive X-ray spectroscopy (EDS) spectra for each of these regions are also shown. The inventors observed the problem that the "columnar" region appears to show more fluorine (11%) compared to the amount of fluorine in the "grain" region (0%) of the coating, and without wishing to be bound by theory it appears that the columnar region allows fluorine from the fluorine plasma to penetrate the yttria coating in these areas which can subsequently damage the underlying quartz.
Figure 11:
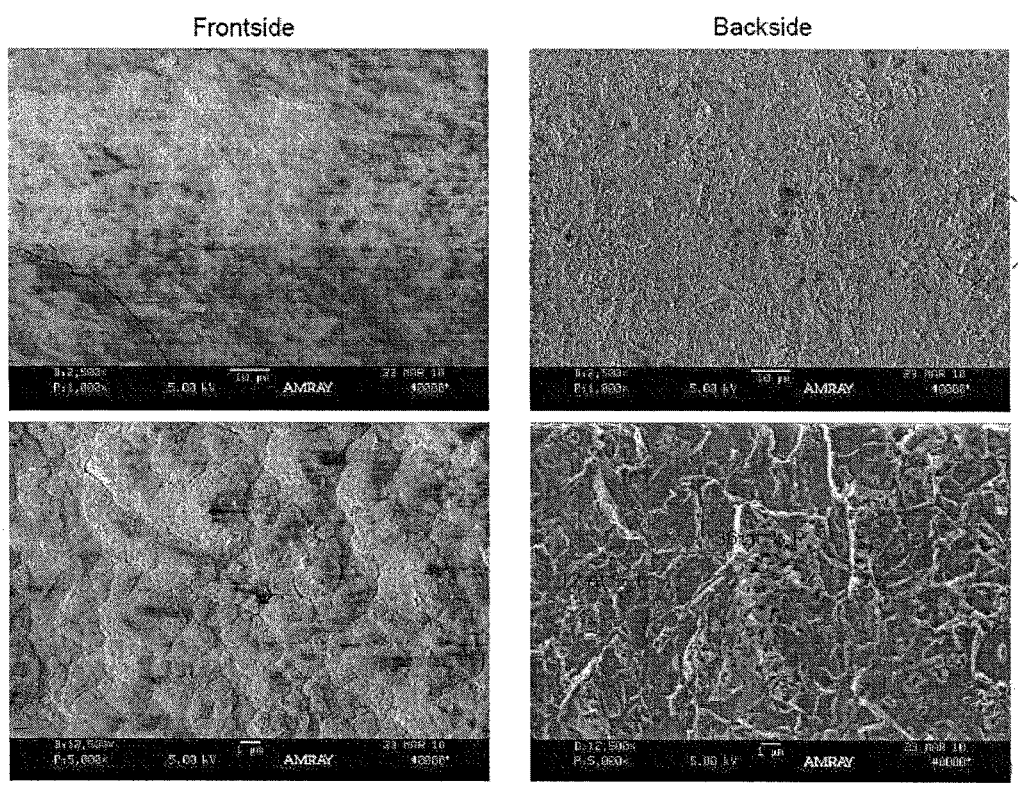
FIG. 11 shows scanning electron micrographs of yttria coating (flakes).
Figure 12:
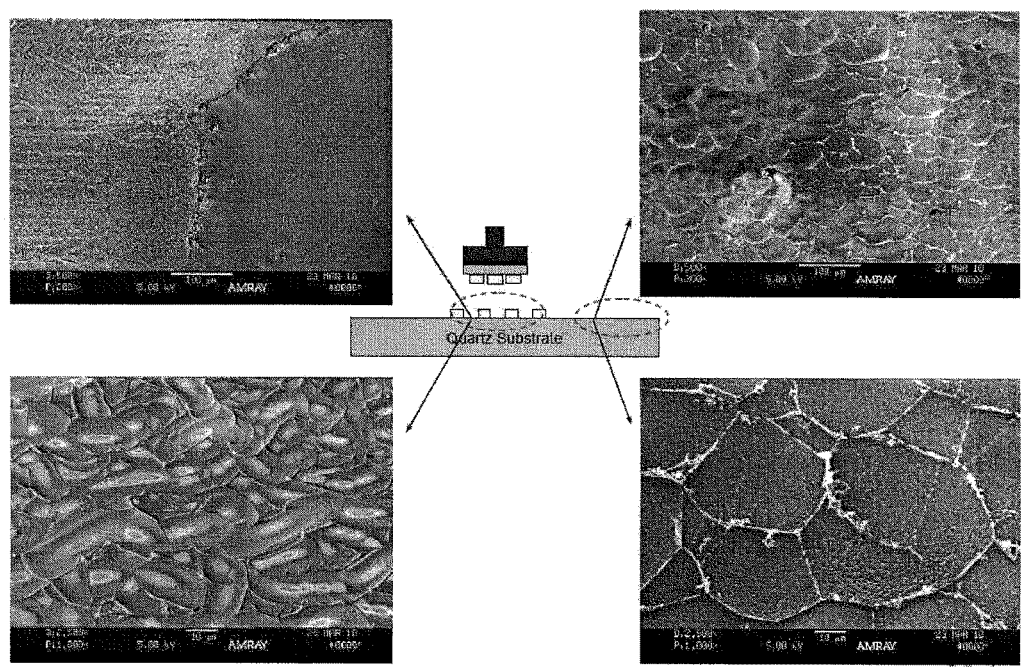
FIG. 12 shows scanning electron micrographs taken of the different parts of the quartz substrate, as shown in the center illustration.
Figure 13:
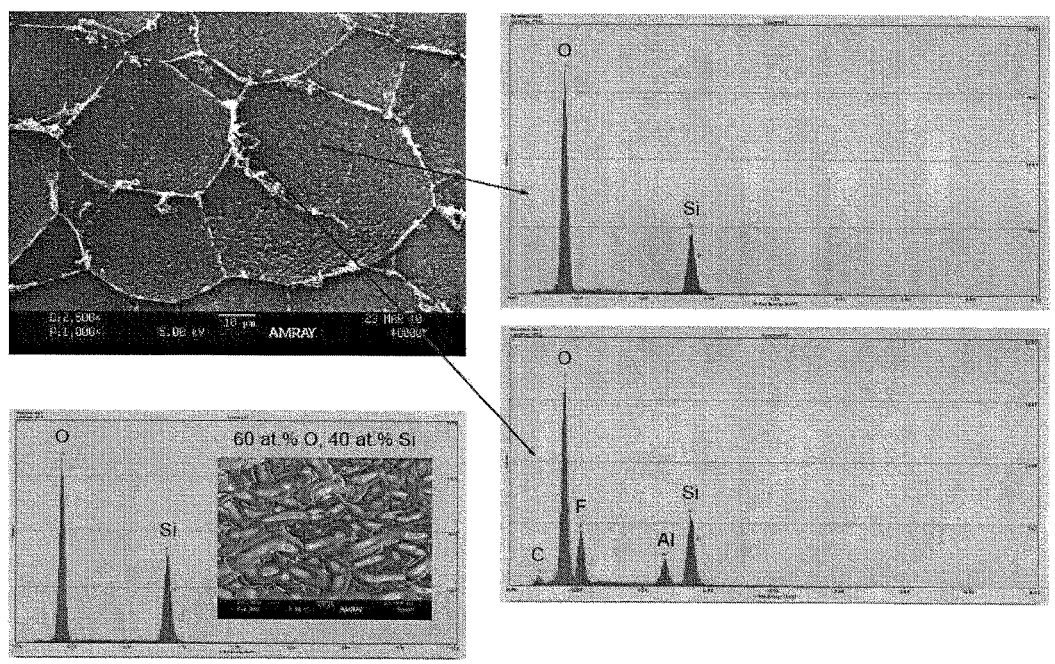
FIG. 13 shows the attack of fluorine plasma on the quartz through the columnar grain structure of the yttria coating.
Figure 14:
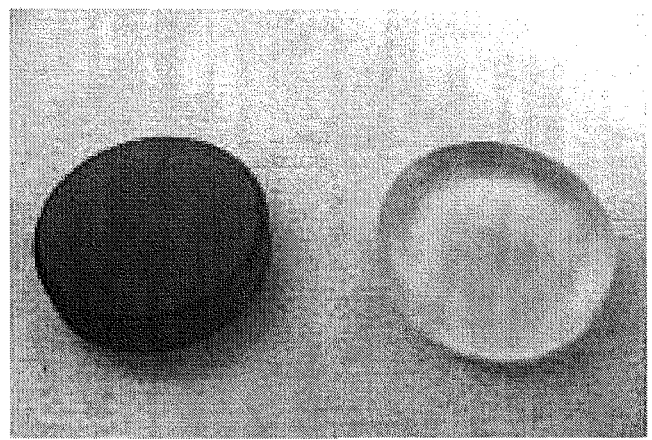
FIG. 14 shows the attack of fluorine plasma on the quartz through the columnar grain structure of the yttria coating.
Figure 15:
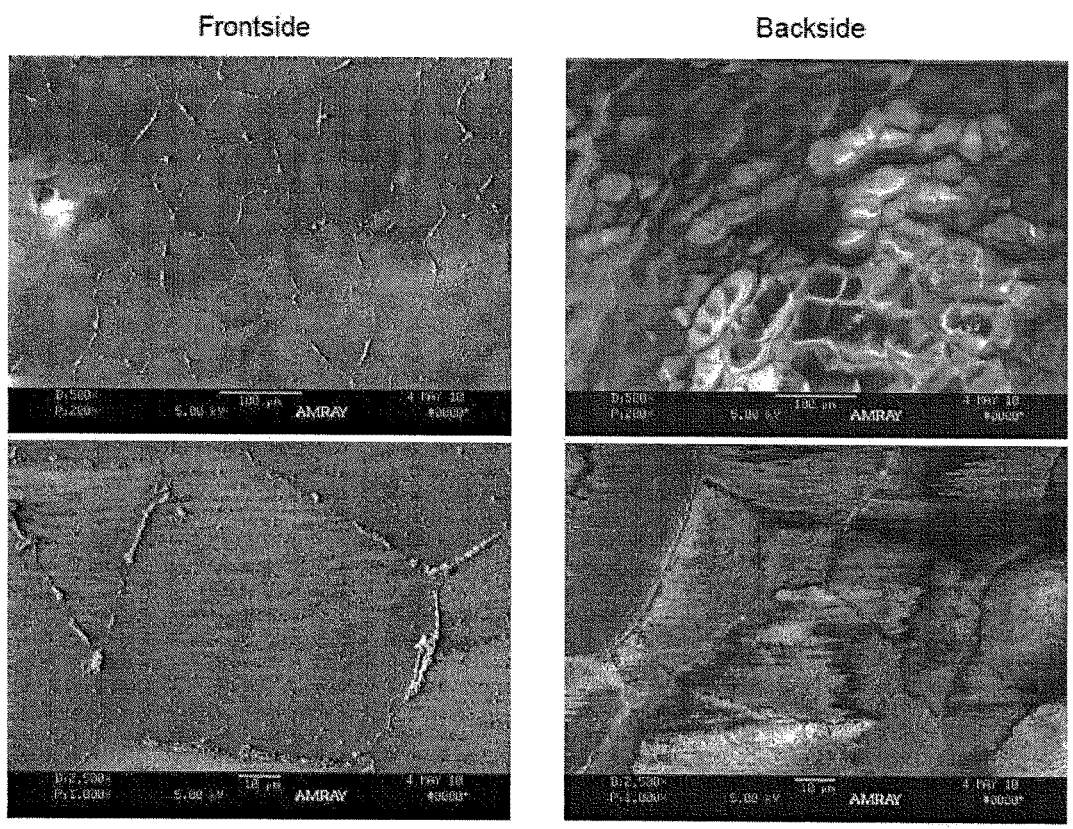
FIG. 15 shows scanning electron micrographs of the frontside and backside of a quartz substrate without yttria coating.
Figure 16:
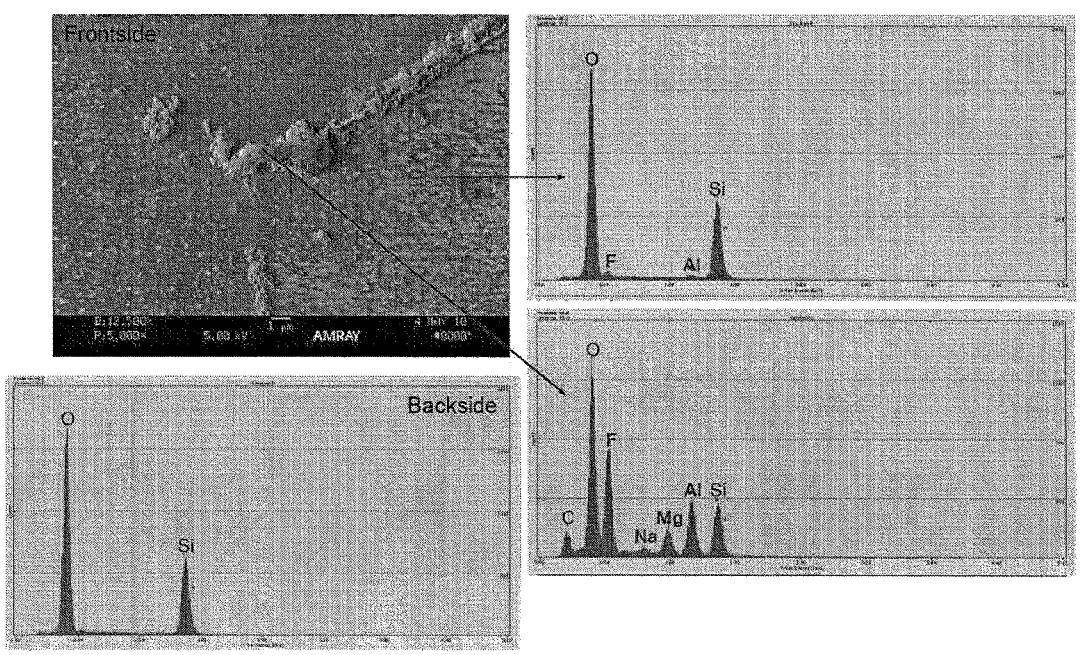
FIG. 16 shows an EDS scan of the frontside and backside of a quartz substrate without yttria coating.
Figure 17:
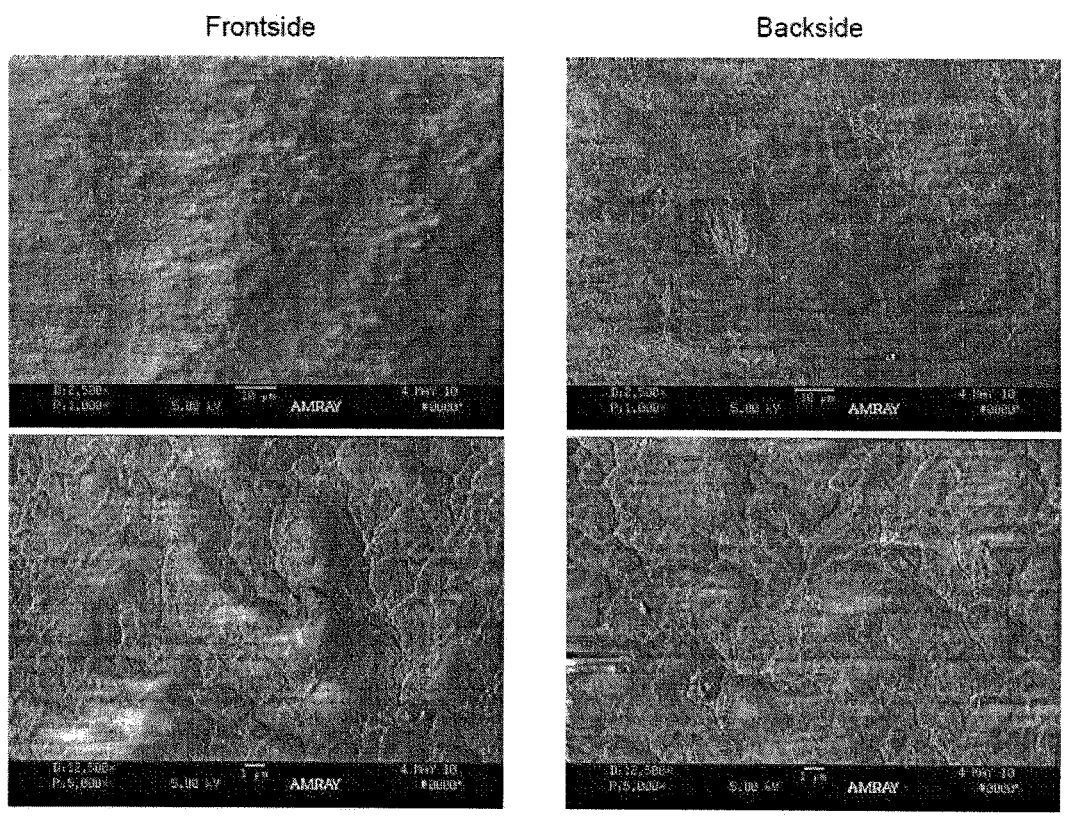
FIG. 17 shows scanning electron micrographs from the frontside and backside of yttria coated quartz.
Figure 18:
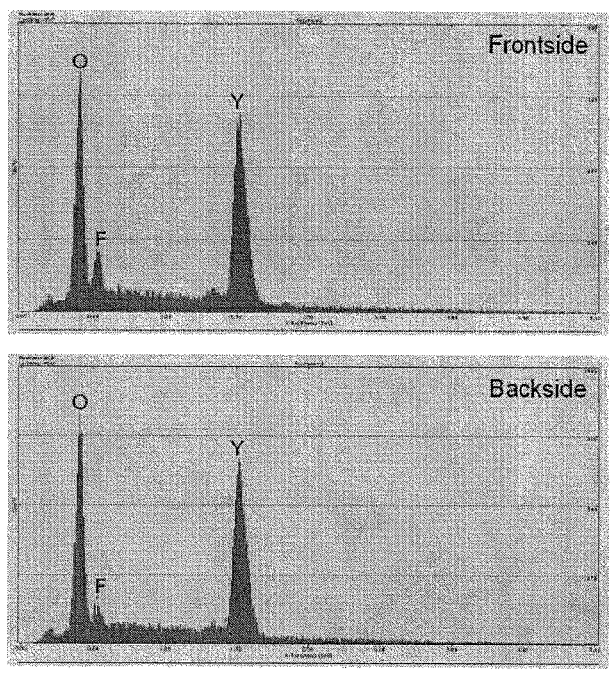
FIG. 18 shows the EDS scans from the frontside and backside of a yttria coated quartz substrate.
Figure 19:
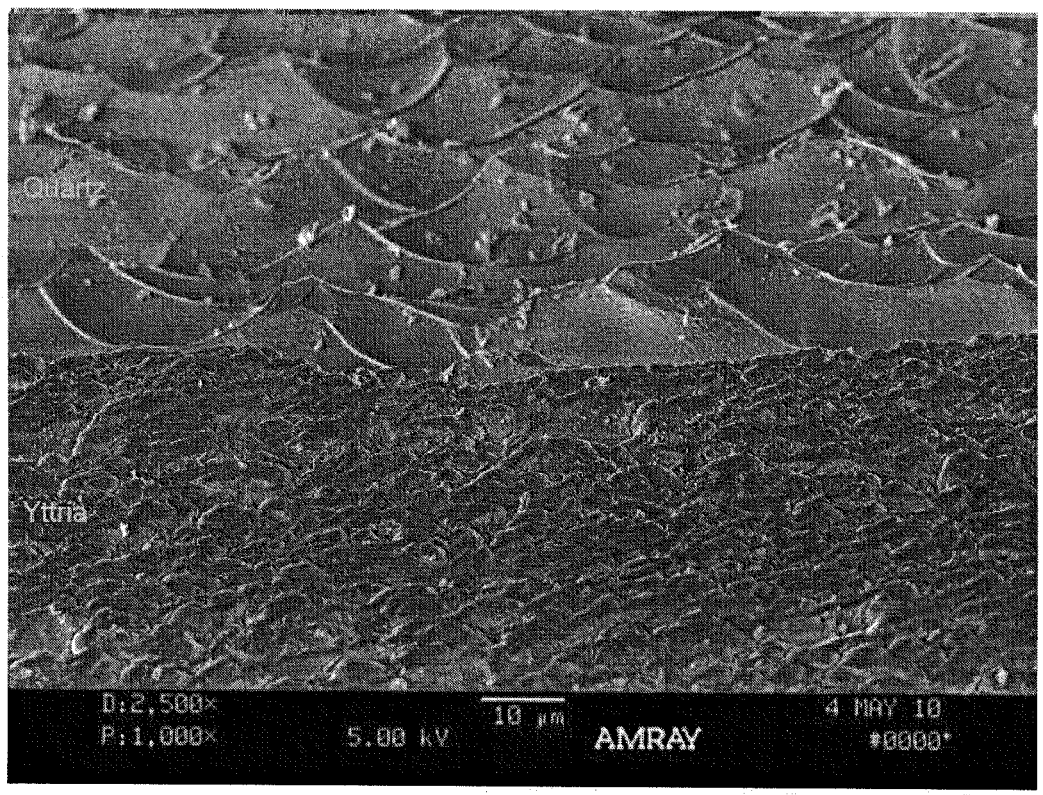
FIG. 19 shows an electron scanning micrograph of the edge of a yttria coated quartz sample.

Details of the yttria coated quartz sample are as follows:
Total thickness of 5 um yttria with barrier layer was deposited on quartz substrate.
Delaminating observed around outer edge of quartz, but most coating still adhered on substrate without peeling off by Scotch® tape test.
Three types of sample were analyzed by SEM and EDS
  Both sides of coating flakes peeling off from quartz substrate
  Exposed quartz substrate previously coated
  Intact coated quartz surface
Due to non-electrical conduction of yttria coating and quartz, charging may affect quality of SEM images.
Summary of Observations
Yttria coating with barrier layer exhibited improved resistance to fluorine corrosion than previous yttria only coating.
Different morphology and composition observed on adhered yttria coating and peeled yttria flakes from edge of quartz substrate.
  Plasma intensity at the edge
See FIG. 1F to FIG. 5. Elemental composition of both AlON coatings and AlON ceramic were analyzed by X-ray photoelectron spectroscopy (XPS) and the results are shown in FIG. 1B.

Example 2

Example 2 is a comparative example of yttria only coating on a quartz substrate.
5 um yttria was deposited on quartz substrate.
Delaminating of yttria coating observed after being processed in oxygen and fluorine plasma environment.
Three types of sample were analyzed by SEM and EDS
  Peeling coating from quartz substrate by carbon tape
  Coating flakes picked up by carbon tape
  Quartz substrate
Due to non-electrical conduction of yttria coating and quartz, charging may affect quality of SEM images.

Summary of Observations
Yttria exhibits columnar structure through thickness of coating.
Fluorine (~15 at. %) was detected from both front and back sides of yttria coating, and residues with higher F concentration (>30 at. %) observed on the backside of coating.
Negligible Si detected on backside of yttria coating.
Analysis on cross-section of yttria coating revealed high H concentration in columnar structure.
Overall quartz substrate consists of stoichiometric silicon dioxide with polycrystalline structure.
Fluoride formed along $SiO_2$ grain boundaries ("intergranular corrosion"), but the bulk of grains remained intact.
Al also detected in grain boundaries, which is possibly segregated impurity (oxide or silicate) and reacts with fluorine to form aluminum fluoride.
Possible mechanism of coating delamination: fluorine penetrates yttria coating through columnar structure boundaries and attacks quartz substrate forming fluoride along grain boundaries, cracking yttria coating on top.
See FIGS. 6 to 13.

Example 3

Example 3 is a comparative example of a yttria only coating on a quartz substrate and a quartz substrate control that were exposed to a fluorine plasma for 6 hours.
Two quartz samples in fluorine plasma for 6 hours
  #1: New quartz sample without yttria coating
  #2: Yttria coated (both side) quartz sample
Frontside (exposed in fluorine) and backside (unexposed in fluorine) were both examined by SEM and EDS.
No delamination of yttria coating observed on sample #2.
See FIGS. 14 to 19.

Example 4

Figure 20:
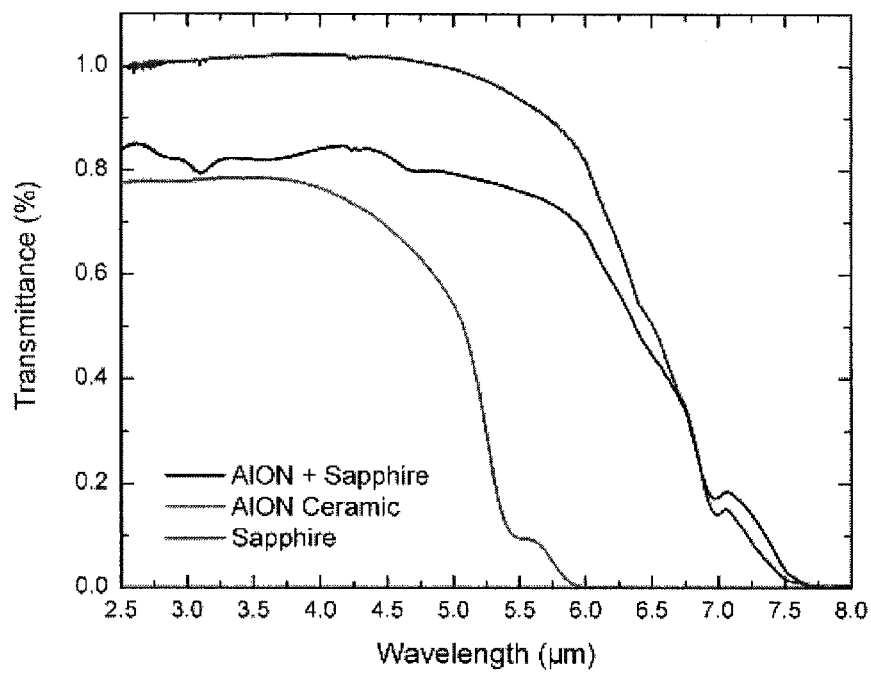
FIG. 20 shows FT-IR transmittance spectra (wavelength 2.5 to 8 μm) of AlON coating, AlON ceramic and sapphire samples.

Example 4 is an infrared (IR) transmittance of AlON coating.
Infrared (IR) property of AlON coatings was characterized by measuring transmittance of 3 µm AlON coated sapphire sample in IR spectral range by Fourier transform infrared (FT-IR) spectrometer.
AlON ceramic (0.125 inch thick) and sapphire (0.02 inch thick) samples as references were also measured IR transmittance.
Sapphire has the 100% transmittance in IR range for wavelength 2.7 to 7.5 µm. AlON coated sapphire has the same IR transparency range as sapphire, but transmittance reduces about 20%. AlON ceramic exhibits a slightly less than 80% IR transmittance in a range from wavelength 2.5 to 6 µm.
See FIG. 20

Example 5

Example 5 is a fluorine etch resistance comparison
AlON coating, bulk Aluminum Oxide, and Aluminum 6061 Alloy were subject to a fluoride plasma.
Etch rate measured using masking and profilometry and data is shown in Table 3.

TABLE 3

| Material | Etch Rate (μm/h) |
| --- | --- |
| AlON (thin film) | 0.25 |
| Aluminum Oxide (Bulk) | 0.33 |
| Aluminum 6061 Alloy | 0.66 |

AlON coating and Quartz were subject to another fluoride plasma.
Etch rate measured using masking and profilometry and data is shown in Table 4.

TABLE 4

| Material | Erosion Rate (μm/h) |
| --- | --- |
| AlON (thin film) | 0.6 |
| Quartz | 10.5 |

These, and other, aspects of the invention will be better appreciated and understood when considered in conjunction with the following description and the accompanying drawings. The following description, while indicating various embodiments of the invention and numerous specific details thereof, is given by way of illustration and not of limitation. Many substitutions, modifications, additions or rearrangements may be made within the scope of the invention, and the invention includes all such substitutions, modifications, additions or rearrangements.

What is claimed is:

1. A substrate comprising a plasma-resistant layer of AlON overlying the substrate, wherein the AlON layer is from about 1 micron to about 10 microns thick, and an outermost plasma-resistant layer of yttria that is from about 1 micron to about 10 microns thick immediately overlying the AlON layer, said layer of yttria does not contain aluminum, the substrate being a component in a semiconductor manufacturing system, wherein the plasma-resistant layer of AlON and the outermost plasma-resistant layer of yttria protect the substrate from plasma exposure during semiconductor manufacturing and the substrate is quartz, alumina, aluminum, steels, metals, or alloys.

2. The substrate of claim 1, wherein the AlON layer is from about 2 microns to about 3 microns thick and the AlON layer has a composition 41 atomic % Al (+/−1 atomic %), 57 atomic % O (+/−1 atomic %), and 2.0 atomic % N (+/−1 atomic %).

3. The substrate of claim 1, wherein said yttria layer has a composition determined by Energy-dispersive X-ray spectroscopy (EDS) that substantially corresponds to the composition of yttria and there is no detectable aluminum in the yttria layer.

4. The substrate of claim 3, wherein the yttria layer is from about 2 microns to about 3 microns thick and the yttria layer has a composition 25 atomic % Y (+/−1 atomic %) and 75 atomic % O (+/−1 atomic %).

5. The substrate of claim 1, wherein the AlON layer, the yttria layer or both are deposited on the quartz substrate by pulsed reactive physical vapor deposition.

6. The substrate according to claim 1, wherein the quartz is stoichiometric silicon dioxide with polycrystalline structure.

7. The substrate of claim 1, wherein the component in the semiconductor manufacturing system is a chamber, chamber component, wafer susceptor, chuck, showerhead, liner, ring, nozzle, baffle, fastener, or wafer transport component.

8. The substrate of claim 1, wherein the substrate is alumina and a total thickness of the AlON layer and the yttria layer is from about 5 microns to about 6 microns.

9. The substrate of claim 1, wherein the substrate is aluminum and a total thickness of the AlON layer and the yttria layer is from about 5 microns to about 6 microns.

10. The substrate of claim 1, wherein the substrate is a metal alloy and a total thickness of the AlON layer and the yttria layer is from about 5 microns to about 6 microns.

11. A substrate consisting of a plasma-resistant layer of AlON overlying the substrate, wherein the AlON layer is from about 1 micron to about 10 microns thick, and an outermost plasma-resistant layer of yttria that is from about 1 micron to about 10 microns thick immediately overlying the AlON layer, said layer of yttria does not contain aluminum, the substrate being a component in a semiconductor manufacturing system, wherein the plasma-resistant layer of AlON and the outermost plasma-resistant layer of yttria protect the substrate from plasma exposure during semiconductor manufacturing and the substrate is quartz, alumina, aluminum, steels, metals, or alloys.

* * * * *